US010090424B1

(12) United States Patent
Pethuraja et al.

(10) Patent No.: US 10,090,424 B1
(45) Date of Patent: Oct. 2, 2018

(54) ROLL-TO-ROLL SOLUTION PROCESS METHOD FOR FABRICATING CIGS SOLAR CELLS AND SYSTEM FOR THE SAME

(71) Applicant: Magnolia Solar, Inc., Woburn, MA (US)

(72) Inventors: Gopal G. Pethuraja, Albany, NY (US); Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 15/204,946

(22) Filed: Jul. 7, 2016

Related U.S. Application Data

(60) Division of application No. 14/518,732, filed on Oct. 20, 2014, now abandoned, which is a continuation of
(Continued)

(51) Int. Cl.
*H01L 21/00* (2006.01)
*H01L 31/032* (2006.01)
(Continued)

(52) U.S. Cl.
CPC ............ *H01L 31/0322* (2013.01); *B05D 1/18* (2013.01); *B05D 7/58* (2013.01); *B32B 43/006* (2013.01); *C25D 7/12* (2013.01); *H01L 31/1876* (2013.01); *H01L 31/1896* (2013.01); *B32B 2255/00* (2013.01); *B32B 2457/00* (2013.01)

(58) Field of Classification Search
None
See application file for complete search history.

(56) References Cited

U.S. PATENT DOCUMENTS

| 4,581,108 A | 4/1986 | Kapur et al. |
| 7,306,823 B2 | 12/2007 | Sager et al. |

(Continued)

OTHER PUBLICATIONS

Repins, et al., "19.9%-Efficient ZnO/CdS/CuInGaSe2 Solar Cell With 81.2% Fill Factor", "Prog Photovolt: Res. Appl.", Feb. 14, 2008, pp. 235-239, No. 16, Publisher: John Wiley & Sons, Ltd.
(Continued)

*Primary Examiner* — Jack Chen
(74) *Attorney, Agent, or Firm* — William A. Loginov; Loginov & Associates

(57) ABSTRACT

A method for fabricating a solar cell commences by bonding a first metal-coated substrate to a second metal-coated substrate to provide a bonded substrate. The bonded substrate is then coated with a first precursor solution to provide a coated bonded substrate. Finally, the procedure de-bonds the coated bonded substrate to provide a first solar cell device and a second solar cell device. A system for fabricating the solar cell comprises a first precursor solution deposition system containing a first precursor solution for deposition on a substrate, a first heating element for heating the substrate after deposition of the first precursor solution, a second precursor solution deposition system containing a second precursor solution for deposition on the substrate, and a second heating element for heating the substrate after deposition of the second precursor solution.

8 Claims, 3 Drawing Sheets

Related U.S. Application Data application No. 13/356,858, filed on Jan. 24, 2012, now Pat. No. 8,865,506.

(51) Int. Cl.

| | |
|---|---|
| *H01L 31/18* | (2006.01) |
| *B05D 1/18* | (2006.01) |
| *B05D 7/00* | (2006.01) |
| *B32B 43/00* | (2006.01) |
| *C25D 7/12* | (2006.01) |

(56) References Cited

U.S. PATENT DOCUMENTS

| | | | |
|---|---|---|---|
| 8,865,506 B1 * | 10/2014 | Pethuraja | H01L 31/0322 438/455 |
| 2003/0140959 A1 | 7/2003 | Gaudiana et al. | |
| 2010/0140101 A1 | 6/2010 | Aksu et al. | |

OTHER PUBLICATIONS

Schock, et al., "CIGS-Based Solar Cells for the Next Millenium", "Prog. Photovolt. Res. Appl.", 2000, pp. 151-160, No. 8, Publisher: John Wiley & Sons, Ltd.

Ganesan, et al., "Diffusion Barrier Properties of Carboxyl- and Amine-Terminated Molecular Nanolayers", "Applied Physics Letters", Jul. 26, 2004, pp. 579-581, vol. 85, No. 4, publisher: American Institute of Physics, Published in: US.

Wang, et al., "Low Temperature Copper-Nanorod Bonding for 3D Integration", "Mater. Res. Soc. Symp. Proc.", 2007, vol. 970, Publisher: Materials Research Society, Published in: US.

Hou, et al., "Low-Temperature Processing of a Solution-Deposited Cuinsse Thin-Film Solar Sell", "Thin Solid Films", 2009, pp. 6853-6856, No. 517, Publisher: Elsevier, Published in: US.

Dhere, "Present Status and Future Prospects of CIGSS Thin Film Solar Cells", "Solar Energy Vlaterials & Solar Cells", Apr. 19, 2006, pp. 2181-2190, No. 90, Publisher: Elsevier, Published in: US.

\* cited by examiner

ROLL-TO-ROLL SOLUTION PROCESS METHOD FOR FABRICATING CIGS SOLAR CELLS AND SYSTEM FOR THE SAME

RELATED APPLICATION

This application is a divisional of co-pending U.S. patent application Ser. No. 14/518,732, filed Oct. 20, 2014, entitled ROLL-TO-ROLL SOLUTION PROCESS METHOD FOR FABRICATING CIGS SOLAR CELLS AND SYSTEM FOR THE SAME, which is a continuation of U.S. patent application Ser. No. 13/356,858, filed Jan. 24, 2012, entitled ROLL-TO-ROLL SOLUTION PROCESS METHOD FOR FABRICATING CIGS SOLAR CELLS AND SYSTEM FOR THE SAME, now U.S. Pat. No. 8,865,506, issued Oct. 21, 2014, the entire disclosure of each of which applications is herein incorporated by reference.

FIELD OF THE INVENTION

The present invention relates to semiconductor-based photovoltaic energy converters, also known as "solar cells," and to the design and fabrication of the same.

BACKGROUND OF THE INVENTION

Electricity produced by a solar cell is expensive due to high solar cell module cost. In order to significantly reduce the cost of solar electricity, it is desirable both to increase cell efficiency as well as to significantly reduce the costs of PV module fabrication.

Copper ternary chalcogenide compounds and alloys are promising light-absorber materials for solar cell applications due to their direct (and tunable) energy band gaps, very high optical absorption coefficients in the visible to near-infrared (IR) spectrum range and high tolerance to defects and impurities. The methods used for preparing light absorption layer of Copper indium-gallium-selenium/sulfur (CIGS) thin film solar cells can be categorized into two classes: (1) high-vacuum vapor deposition method (thermal evaporation, and magnetron sputtering) and (2) non-vacuum liquid phase method (spraying, printing and electro-deposition).

CIGS thin film solar cells have been recognized as the next generation of solar cells. CIGS solar cells have the advantages of low cost, high efficiency, long-term stability, superior performance under weak illumination, and desirable resistance to radiation. However, commercial mass production of reliable CIGS thin film solar cells has been challenging because of the complicated conventional process for preparing the light absorption layer of CIGS thin film solar cells, leading to a low yield rate and a high production cost.

The CIGS thin films having a small area that is prepared by vacuum vapor deposition methods possess excellent quality, and the corresponding solar cells can exhibit very high photoelectric conversion efficiencies. As disclosed by the US National Renewable Energy Laboratory (NREL), a highest efficiency of 19.9% has been achieved with a copper-indium-gallium selenium thin film solar cell with an effective area of 0.419 $cm^2$ prepared by the three-stage co-evaporation process. Refer to Ingrid Repins, Miguel A. Contreras, Brian Egaas, Clay DeHart, John Scharf, Craig L. Perkins, Bobby To and Rommel Noufi, "19.9% efficient ZnO/CdS/CuInGaSe2 solar cell with 81.2% fill factor", Prog. Photovolt: Res. Appl. 16 (2008) 235, for useful background information.

However, it would be difficult to ensure the uniformity of thin films when these methods are used for the deposition of thin film solar cells having a large area. Moreover, various factors such as low yield rate resulting from the complexity of those processes, high capital investment, low raw material utilization rate and low productivity, leads to a very high production cost, which prohibits the mass production of CIGS thin film solar cells by these methods.

It is desirable to achieve substantial cost reduction when using non-vacuum liquid phase methods and large area thin films can be conveniently deposited. Various low cost non-vacuum liquid phase methods were developed for the preparation of light absorption layer of CIGS thin films.

Electro-Deposition:

U.S. Pat. No. 4,581,108 discloses a method utilizing a low cost electro-deposition approach for metallic precursor preparation for a two-stage processing technique. In this method a Copper (Cu) layer is first electrodeposited on a substrate. This is then followed by electro-deposition of an In layer forming a Cu/In stack during the first stage of the process. In the second state of the process, the electrodeposited Cu/In stack is heated in a reactive atmosphere containing Se forming a $CuInSe_2$ compound layer.

More recently, U.S. Pat. No. 2010/0140101 A1 discloses a method including electrodepositing a film stack of Cu, In, Ga, then a Cu—In binary alloy film followed by a electro-deposition of Se layer, reacting the precursor stake form an absorber layer. Low cost, high utilization rate of raw materials and facile deposition of large area thin films are typical advantages of electrochemical deposition method. However, very large gaps existing between reduction potentials of Cu, In and Ga often bring about enrichment of copper, great difficulties in the stoichiometry control and high concentration of impurities in the produced thin films. Subsequent modification of the stoichiometry of thin films by PVD/electro-deposition is usually necessary, which leads to a sharp increase in production cost.

Spray Pyrolysis:

Spray Pyrolysis is a cost efficient method to prepare CIGS thin films. However, high concentration of detrimental impurities, high roughness and un-uniformity in large area thin films hindered the practical utilization of this method. It is further very difficult to prepare CIGS thin films qualified for the photovoltaic devices by spray pyrolysis, and solar cells prepared by this process show extremely low photoelectric conversion.

Ink Printing:

Non-oxide-based non-vacuum liquid phase method was developed by Nanosolar corp. for preparing CIGS thin films (see U.S. Pat. No. 7,306,823). This method comprises the following steps: (1) preparing nanoparticles or quantum dots of copper or indium or gallium or selenium; (2) coating the surface of nanoparticles or quantum dots with one or more layers of copper, indium, gallium, and selenium, etc. wherein the stoichiometry ratios between different elements in the coated nanoparticles are controlled by adjusting the composition and thickness of the coating layer; (3) dispersing the coated nanoparticles in a solvent to produce a slurry; (4) forming a precursor thin film from the slurry by a non-vacuum process such as printing, etc.; and (5) short annealing the precursor film to produce the targeted CIGS thin films.

Low cost, high utilization rate of raw materials, applicability of flexible substrates and facile deposition of large area thin films can be readily achieved by this method. However, since nano-particles are used in this method, and parameters of the coated nanoparticles, such as particle size, size distribution, surface morphology and stoichiometry are very hard to be precisely controlled, thus resulting in unfavorable controllability, high complexity and poor reproducibility of the process.

Prior art methods for producing CIGS thin films exhibits low-throughput and expensive due to use of final high temperature annealing process or another, which hampers the large-scale commercialization of CIGS thin film solar cells. It is desirable to develop a novel method for producing CIGS thin films that can overcome the disadvantages described hereinabove, and is highly applicable to the industrialization of CIGS thin film solar cells.

An innovative process approach that offer high throughput, large area uniformity, and inexpensive roll-to-roll compatibility is needed.

SUMMARY OF THE INVENTION

The present invention overcomes the disadvantages of the prior art by providing a method of forming solar cell structure having a chalcopyrite absorber layer, in a continuous roll-to-roll high yield solution based process, and system for the same.

According to an illustrative embodiment, bonded substrate with metal contacts exposed to atmosphere is formed. Multiple precursor solutions of metal chalcogenide dissolved in a solvent is then formed. Dip-coating or electro-deposition in an inert environment is then used to form a metal chalcogenide on both sides of the substrate.

A buffer layer is formed adjacent to a side of the metal chalcogenide layer opposite the substrate. The substrate is then debonded using a wet chemical adhesive remover. A transparent conductive contact is formed on the buffer layer opposite the metal chalcogenide layer. Commercially available bonding adhesives and adhesive removers are used for bonding and de-bonding the substrates, such as various types of bonding adhesives and adhesive removers provided by McMASTER-CAR.

BRIEF DESCRIPTION OF THE DRAWINGS

The invention description below refers to the accompanying drawings, of which.

DETAILED DESCRIPTION

The present invention provides a method of forming solar cell structures having a chalcopyrite absorber layer, in a continuous roll-to-roll high yield solution based process.

A high yield process is achieved by coating active layers on both sides of a substrate. Most of the solution process offers deposition of the entire surface of a substrate (front and back) with uniform film composition. Our approach unitizes these benefits offered by the solution process to fabricate low cost high efficiency device structures.

Figure 1:
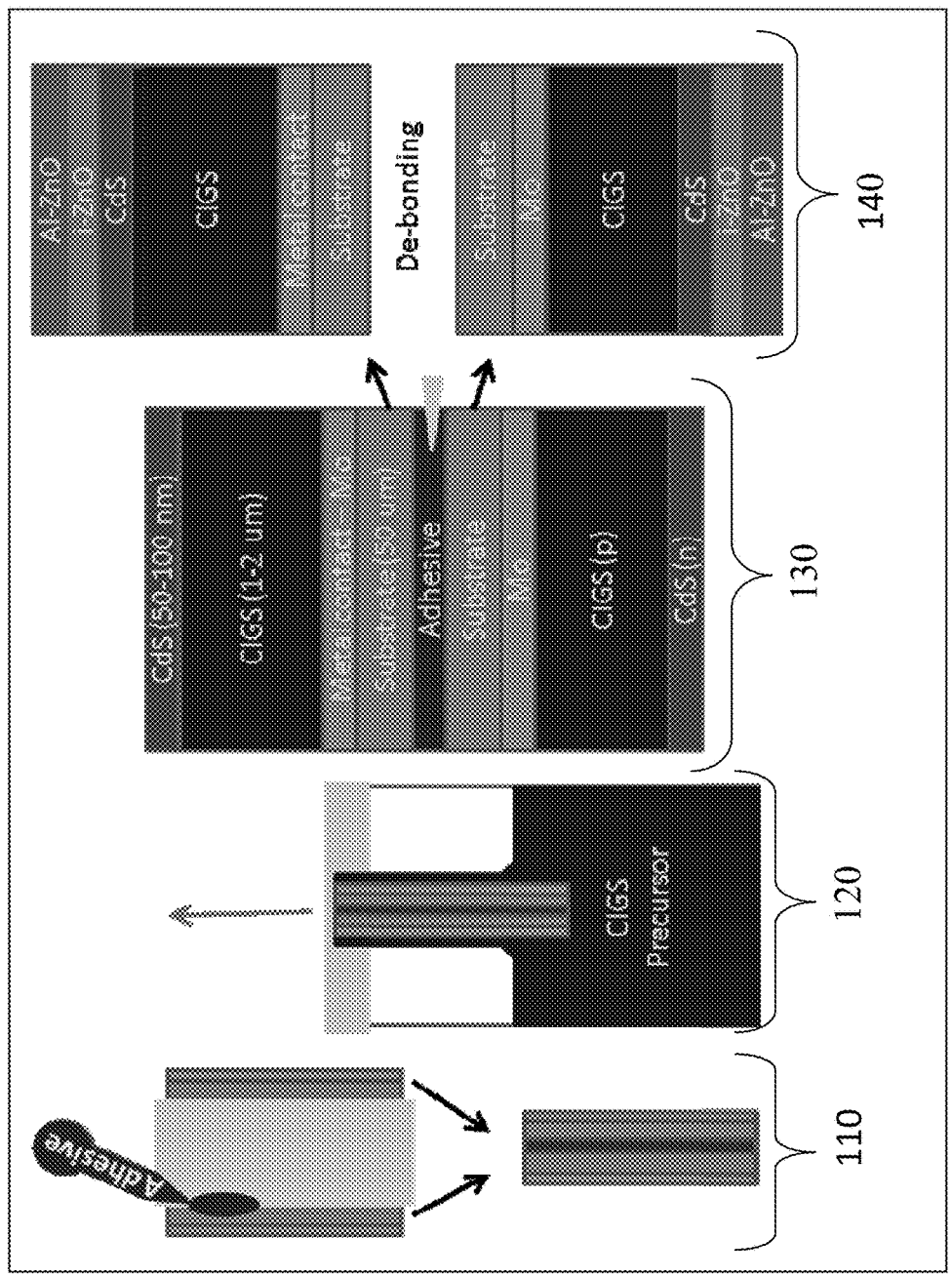
FIG. 1 is a schematic diagram of a procedure, and the different stages thereof, for fabricating thin film solar cells according to an illustrative embodiment, including a schematic cross-sectional view of the solar cell device.

Reference is made to FIG. 1 showing a schematic diagram of a procedure for fabricating a thin film solar cell. At 110, a bonded substrate with metal contacts exposed to atmosphere is formed by applying adhesive to adhere a first substrate together to a second substrate. Multiple precursor solutions of metal chalcogenide dissolved in a solvent is formed. Dip-coating or electro-deposition in an inert environment is used to form a metal chalcogenide on both sides of the substrate as shown at 120 and 130.

A buffer layer is formed adjacent to a side of the metal chalcogenide layer opposite the substrate as shown at 130. Substrate is debonded using wet chemical adhesive remover. A transparent conductive contact is formed adjacent to a side of the buffer layer opposite the metal chalcogenide layer as shown at 140. Commercially available bonding adhesives and adhesive removers are used for bonding and de-bonding the substrates, such as the various types of bonding adhesives and adhesive removers provided by McMASTER-CAR.

Figure 2:
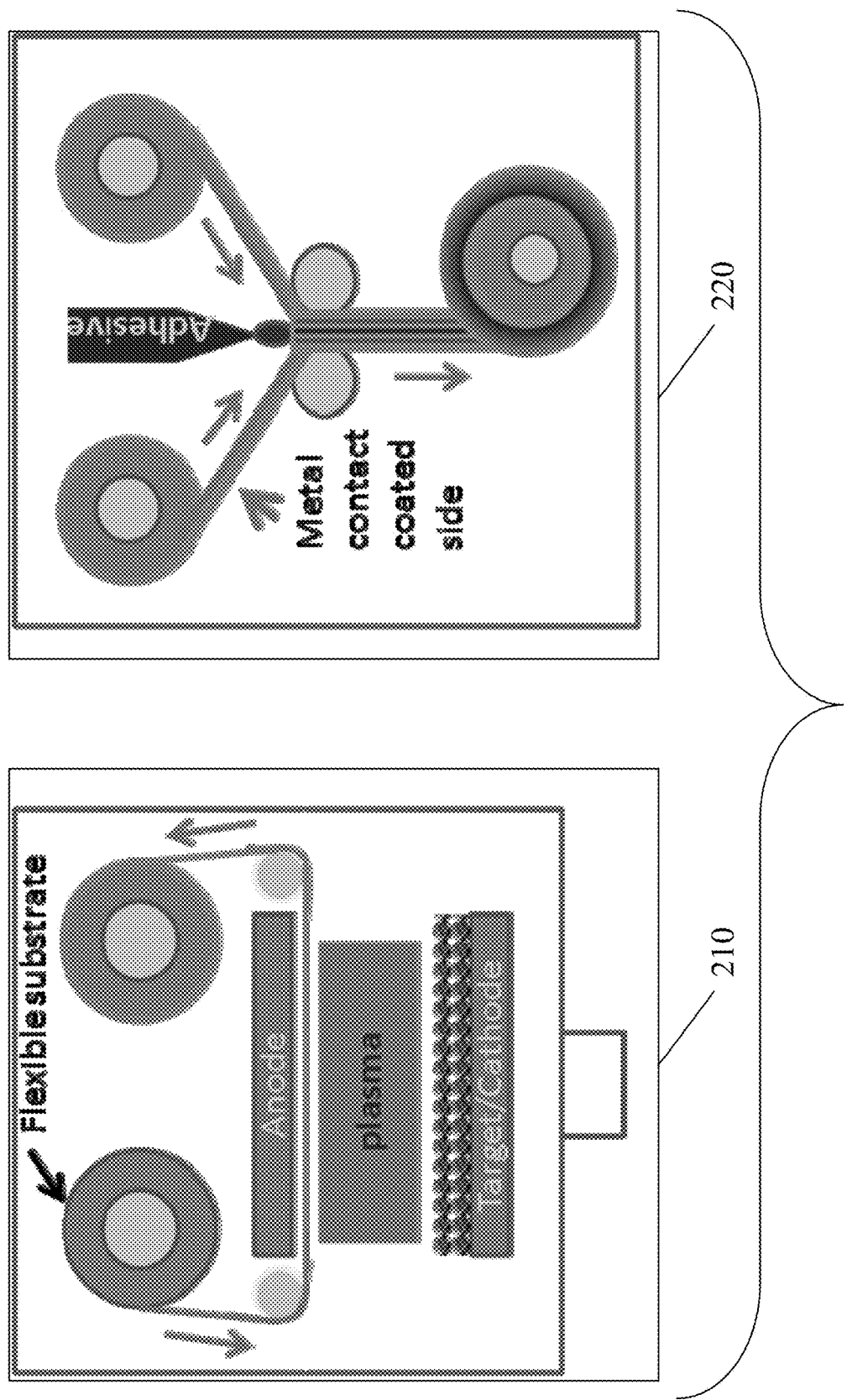
FIG. 2 is a schematic diagram of a roll to roll metal deposition and bonding procedure, according to an illustrative embodiment.

Bonded Substrate Roll:

According to illustrative embodiments, the substrate comprises stainless steel foil, polymer foil such as polyimide or any other appropriate flexible substrate. First, as shown in FIG. 2, at 210 a metal back contact layer is coated on one side of the flexible substrate and the other side is left without coating. Molybdenum layer is the most common metal contact layer for CIGS absorber. Other absorber materials known in the art can also be employed. Sputter deposition method is the most commonly used method for depositing metal contact layer. Other solution methods such as electro-deposition and spray coating can be used. At 220, the coated substrates are bonded together such that the metal layer surfaces are exposed to atmosphere. The bonded substrate approach allows us to use much thinner substrate compare to conventional approaches, resulting in cost reduction of substrate material usage.

Figure 3:
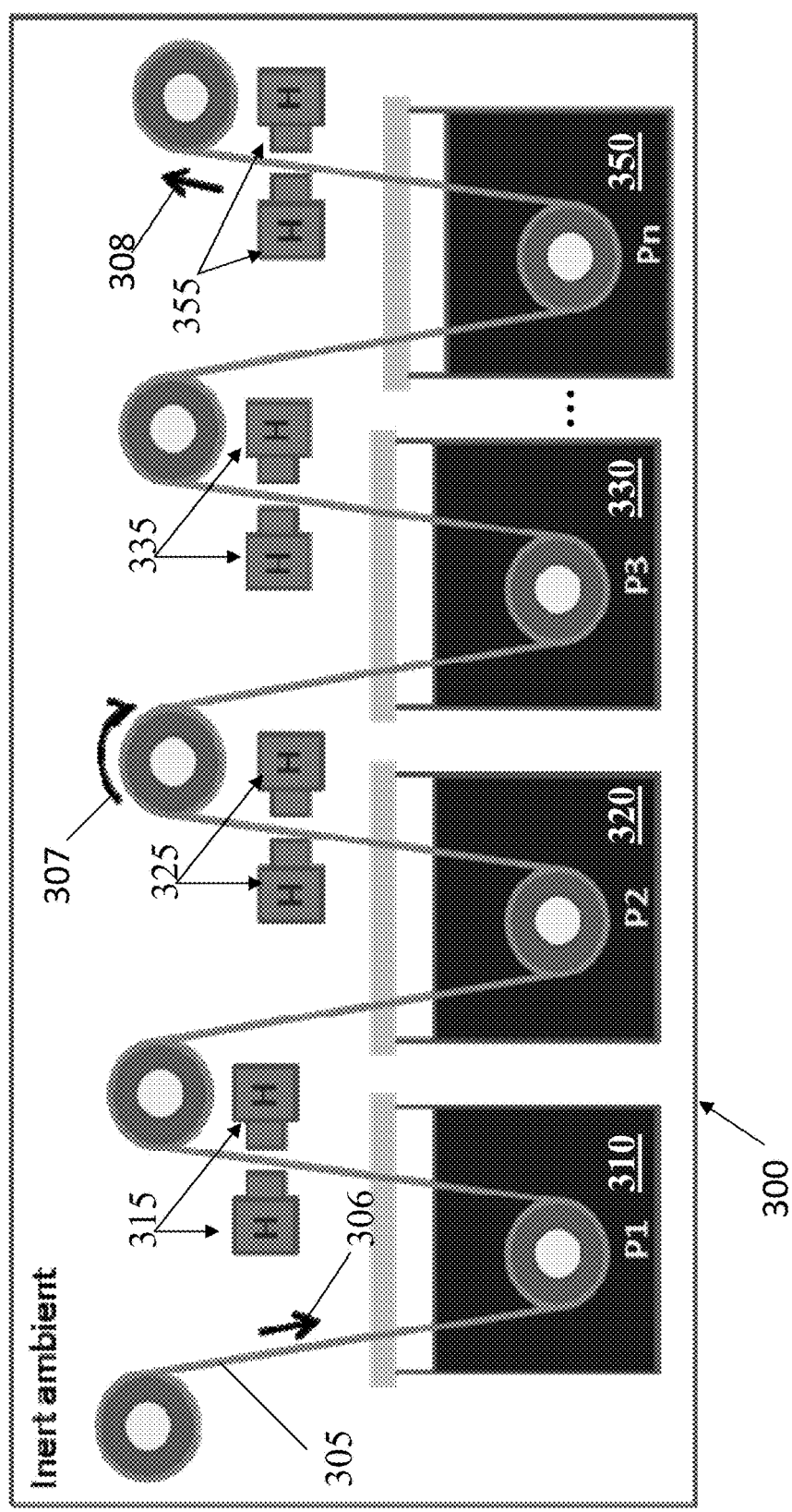
FIG. 3 is an overview schematic block diagram of a system for fabricating a CIGS light absorber and buffer layer through a roll-to-roll solution process, according to the illustrative embodiments.

Precursor Film Deposition:

Reference is made to FIG. 3, showing a schematic diagram of the steps of the procedure 300 for forming CIGS light absorber and buffer layer structure through a roll-to-roll solution process approach. A bonded metal coated flexible substrate 305 passes through the roll-to-roll process as shown by arrow 306. The substrate 305 continues along the path as shown by arrows 307 and 308. Multiple precursor-film deposition systems 310, 320, 330, 340 are shown. Note that although only four precursor solution systems are shown, any number of precursor solution systems can be employed to achieve the desired resulting solar cell structure. Each precursor-film deposition is followed by a heating/drying zone (H) 315, 325, 335, 355, respectively. The precursor-film deposition system (P) is a dip-coater/chemical bath deposition system or an electro chemical deposition system. Other deposition processes known in the art as being application in roll-to-roll processing can also be employed. The heating/drying zones (H) 315, 325, 335, 355 contain IR lamps or other radiant heating sources.

The precursor solutions are prepared by dissolving copper chalcogenides in hydrazine or non-hydrazine solvents. For useful background information regarding precursor solutions, refer to Neelkanth G. Dhere, "Present status and future prospects of CIGSS thin film solar cells", Solar Energy Materials and Solar Cells 90 (2006) 2181. The precursor solutions can also be prepared by dispersing various binary metal chalcogenide nanoparticles in a solution. A self-assembled molecular monolayer can be used to anchor the nanoparticle on the surface of the substrate. For creating graded light absorber materials, a series of precursor solutions each having varying compositions are employed.

The first film deposition system (P1) 310 creates ultra-thin precursor-film (approximately a few nm thick). The heater (H) 315 evaporates the solvent and also crystallizes the film, resulting in nano-particle type nucleation sites on both sides of the substrate. At nano-scale, the melting point of a material is much lower than its bulk melting point. Hence, the crystallization occurs at lower thermal budget. These nucleation center seeds the growth of columnar grains during subsequent film deposition. The ultra-thin layer is achieved by using highly diluted precursor solution.

The second (P2) 320 and following deposition steps create an optimal thick film that is suitable for grain growth and ultra pure polycrystalline films. During the heating 325, 335, 355, the film grain growth or re-crystallization occur on the grains that created in the first film deposition step. The grain growth in each deposition step leads to columnar grains with minimal grain boundaries.

The illustrative procedure provides high quality columnar grains in a reduced thermal budget compare to conventional approach. Conventional prior art approaches require higher thermal budget, because the thermal budget is used for diffusion and reaction of elemental atoms for the entire thickness of the film (approximately 1-2 um thick). Our layer-by-layer approach reduces the thermal budget and creates high quality films. Solvent based organic and other impurities are effectively removed during heating. In layer by layer approach, the impurity atom has a very short escape length (few tens of nm) and hence the impurities are effectively removed from the film in much lower thermal budget.

The illustrative embodiments yield pinhole free film with higher uniformity. The roll-to-roll solution process offers composition uniformity for the entire width of the substrate. By maintaining the PH value and concentration of the precursor solution, composition uniformity is achieved for entire length of the roll (i.e. substrate). At each layer-by-layer deposition throughout the process, the precursor solution fills the hill and valley type formations created in the previous deposition step, thereby yielding higher thickness uniformity.

The final deposition system (Pn) 350 contains the precursor solution of a buffer layer such as CdS. The thickness of the buffer layer is approximately 50 nm but variable within ordinary skill. The substrate is debonded using wet chemical adhesive remover, yielding two separate solar cell modules (as shown at 140 in FIG. 1). On top of the buffer layer, transparent conductive oxide film (i-ZnO/Al:ZnO) is deposited. This process is performed using a roll-to-roll sputtering process (after debonding the substrate) or a roll-to-roll solution process (before debonding the substrate).

Advantages of the illustrative embodiments include (1) inexpensive (due to non-requirement of expensive ultra-high vacuum systems), (2) high throughput (due to roll to roll process and also depositing both sides), (3) high quality film (due to layer by layer drying/annealing), (4) low thermal budget (due to use of size dependent melting point reduction); (5) thin substrate feasible (due to bonded substrates); and (6) single band gap layer or graded band gap layers are easily formed (conventional approach uses a final step of high temperature annealing/selenization, that limits the ability to control the composition grading in the film), among other advantages.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or external conduit is expressly contemplated and highly variable within ordinary skill. More generally, while some ranges of layer thickness and illustrative materials are described herein, it is expressly contemplated that additional layers, layers having differing thicknesses and/or material choices can be provided to achieve the functional advantages described herein. In addition, directional and locational terms such as "top," "bottom," "center," "front," "back," "above," and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A method for fabricating a solar cell, the method comprising:
    coating a metal contact layer on a first side of a flexible substrate in a continuous roll-to-roll process to provide a first metal coated substrate roll and a second metal coated substrate roll;
    bonding uncoated side of the first metal-coated substrate to uncoated side of the second metal-coated substrate in a continuous roll-to-roll bonding process to provide a bonded substrate;
    coating active layer on both sides of the bonded substrate with a plurality of active layer precursor solutions in a layer by layer continuous roll-to-roll process to provide an active layer coated substrate;
    coating buffer layer on both sides of the active layer coated substrate with a plurality of buffer layer precursor solutions in a layer by layer continuous roll-to-roll process to provide a buffer layer coated substrate;
    coating transparent conductive oxide layer on both sides of the buffer layer coated substrate with a plurality of transparent conductive oxide layer precursor solutions in a layer by layer continuous roll-to-roll process to provide a transparent oxide layer coated substrate;
    coating metal grids on both sides of the transparent oxide layer coated substrate in a continuous roll-to-roll screen printing process to provide a bonded solar cells; and
    de-bonding the bonded solar cells to provide a first solar cell roll and a second solar cell roll.

2. The method of claim 1 where in the substrate comprises of at least one of stainless steel foil, polymer foil, or polyimide.

3. The method of claim 1 where in the coating process comprise of at least one of dip coating, electroplating, electroless plating, screen printing, sputter deposition, followed by a drying process in an inert environment.

4. The method of claim 1 where in the layer by layer continuous roll-to-roll process comprise of coating multiple precursor layers of same compound in a contiguous roll to roll process with a control over the composition of each layer.

5. The method of claim 1 where in the active layer precursor solution is a copper indium selenium/sulfur (CIGS) precursor.

6. The method of claim 1 where in the buffer layer precursor solution is a cadmium sulfide precursor.

7. The method of claim 1, where in the transparent conductive oxide layer precursor solution is an aluminum doped zinc oxide precursor or an indium tin oxide precursor.

8. The method of claim 1 where in the active layer coating consists of coating multiple active layer precursors with variations in precursor composition, to achieve bandgap gradient requirement in active layer of the solar cell.

* * * * *